United States Patent
Biagi et al.

(10) Patent No.: US 7,359,173 B2
(45) Date of Patent: Apr. 15, 2008

(54) SYSTEM AND METHOD FOR PROTECTING IC COMPONENTS

(75) Inventors: Hubert J. Biagi, Tucson, AZ (US); Ravi Balasingam, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 24 days.

(21) Appl. No.: 11/190,149

(22) Filed: Jul. 26, 2005

(65) Prior Publication Data

US 2007/0025038 A1 Feb. 1, 2007

(51) Int. Cl.
*H02H 5/04* (2006.01)
(52) U.S. Cl. .................................................. 361/104
(58) Field of Classification Search ................ 361/104
See application file for complete search history.

(56) References Cited

U.S. PATENT DOCUMENTS 5,309,394 A * 5/1994 Wuertz et al. ......... 365/189.03
6,342,807 B1 * 1/2002 Nolan et al. .................. 327/525
6,483,344 B2 * 11/2002 Gupta .......................... 326/41
6,703,885 B1 * 3/2004 Fan et al. ..................... 327/308

* cited by examiner

*Primary Examiner*—Michael Sherry
*Assistant Examiner*—Lucy Thomas
(74) *Attorney, Agent, or Firm*—J. Dennis Moore; W. James Brady, III; Frederick J. Telecky, Jr.

(57) ABSTRACT

One embodiment provides a system for protecting at least one component in an integrated circuit (IC). The system includes a disconnect element that is electrically connected in series between a terminal of the IC and the at least one component. The disconnect element is configured to have a first state to permit an electrical signal to propagate from the terminal to the at least one component and a second state corresponding to a high impedance condition that electrically disconnects the terminal relative to the at least one component. A control system is configured to cause the disconnect element to transition from the first state to the second based on at least one predetermined activation condition.

12 Claims, 5 Drawing Sheets

SYSTEM AND METHOD FOR PROTECTING IC COMPONENTS

TECHNICAL FIELD

This invention relates to electronic circuits, and more specifically to a system for protecting components in integrated circuits.

BACKGROUND

Integrated circuits (ICs) are widely used in many applications. ICs can include a variety of circuitry that can operate as stand alone systems or in conjunction with other circuit components. ICs include an arrangement of pins that provide means for receiving power as well as for communicating information relative to the IC. As a result, ICs are vulnerable to external environmental conditions through such pins. For example, ICs can be damaged by electrostatic discharge (ESD) events, in which large currents flow through the IC usually initiated at one or more pins.

The vulnerability of IC chips to ESD and other events has created need for ESD protection circuits. Consequently, ESD protection circuits are often added to the integral design of IC chips. Many conventional ESD protection schemes for ICs employ peripheral dedicated circuits to carry the ESD currents from the pin or pad of the device to ground by providing a low impedance path. In this way, the ESD currents flow through the ESD protection circuitry, rather than through the more vulnerable circuits in the chip.

FIG. 1 depicts an example of part of an IC 2 that includes an electrically erasable programmable read-only memory (EEPROM) 4. The EEPROM 4 can be programmed by providing an enable input signal at a pin (ENB) 6. The pin 6 also can provide an enable signal to other circuitry, such as to enable internal logic. One or more ESD protection circuits 8 can be associated with the pin 6. For example, a first ESD protection circuit can be connected directly at the pin 6. Another ESD protection circuit 8 can be connected to the signal path between a resistor R and the EEPROM 4. The ESD protection circuit 8, for example, can include a fast switch or clamp and RC filter that is activated as a function of the signal at the pin 6 to shunt current away from the EEPROM 4 during an ESD event. The ESD protection circuit 8 can divert current from the input and discharge the current through the ESD protection circuit, thus protecting the EEPROM 4 from damage resulting from the ESD event.

Conventional ESD protection, however, may not be capable of providing adequate protection in all circumstances. For instance, some types of ICs include programmable circuitry, such as electrically programmable read only memory (EPROM), that may require higher voltages be applied at one or more pins to implement certain modes (e.g., programming mode) of operation. Since the higher voltages are applied to the ICs, conventional ESD protection have to be modified to allow operation at the higher voltages and thus may become ineffective in suppressing certain transient events. Accordingly, a spike in the input voltage at an input pin, such as may be due to applying an external voltage or to parasitic conditions, could cause inadvertent re-programming or poor field retention by certain IC chips.

SUMMARY

The present invention relates to electronic circuits, and more particularly to a system and method for protecting circuit components in an integrated circuit (IC) from voltages applied at an input pin. The system operates by electrically disconnecting the pin from the internal components of the IC in response to an activation condition, such as may be based on a voltage at the input pin as well as an operating mode of the circuit components being protected.

One embodiment provides a system for protecting at least one component in an integrated circuit (IC). The system includes a disconnect element that is electrically connected in series between a terminal of the IC and the at least one component. The disconnect element is configured to have a first state to permit an electrical signal to propagate from the terminal to the at least one component and a second state corresponding to a high impedance condition that electrically disconnects the terminal relative to the at least one component. A control system is configured to cause the disconnecting element to transition from the first state to the second based on at least one predetermined activation condition.

Another embodiment of the present invention provides an integrated circuit (IC) chip that includes a first pin and a disconnect element electrically connected between the first pin and protected circuitry. The disconnect element is configured to have a first condition to electrically connect the first pin to the protected circuitry and a second condition that electrically disconnects the first pin relative to the protected circuitry. A first signal is provided to the first pin normally at one of a regulated voltage for the IC and a voltage that exceeds the regulated voltage (for example, the programming voltage of the EEPROM, which is typically about twice the regulated voltage). A second pin is connected to provide a second signal for use by the protected circuitry. The second signal is provided normally at or below the regulated voltage (e.g., for providing programming data to the protected circuitry). A control system is configured to cause the disconnect element to transition from the first state to the second state and to remain permanently the second state in response to detecting an activation condition.

Yet another aspect of the present invention provides an integrated circuit (IC) that includes a first pin and a disconnect element electrically connected between the first pin and programmable circuitry within the IC. The disconnect element is configured to have a first condition to electrically connect the first pin to the programmable circuitry and a second condition that electrically isolates the first pin relative to the programmable circuitry. A signal is provided at the first pin at a regulated voltage for normal operation of the IC and at a higher program voltage, which that exceeds the regulated voltage, for implementing programming the programmable circuitry. A register receives a second signal having data for programming the programmable circuitry, the second signal being normally provided at or below the regulated voltage. A control system is configured to cause the disconnect element to transition from the first state to the second in response to detecting an activation condition, the activation condition being detected based on the first signal and the second signal.

DETAILED DESCRIPTION

The present invention relates to electronic circuits, and more particularly to a system and method for protecting circuit components in an integrated circuit (IC) from voltages applied at one or more pins. The system operates by electrically disconnecting the pin from the internal components of the IC in response to an activation condition. The disconnect between the pin and the internal components can be permanent or it can be programmable. The disconnect can be implemented at a location in the IC that still permits signals applied at the pin to be supplied to other, less vulnerable circuitry.

Figure 1:
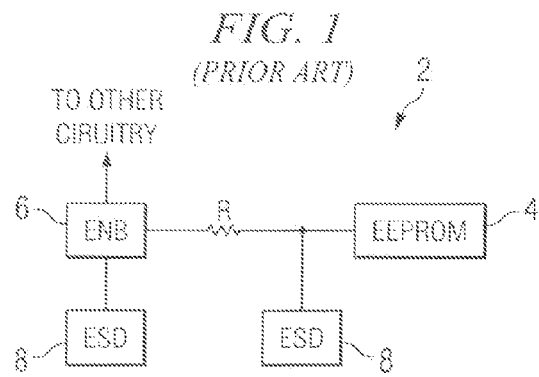
FIG. 1 illustrates an example of part of an IC that contains a prior art ESD detection and protection circuit.
Figure 2:
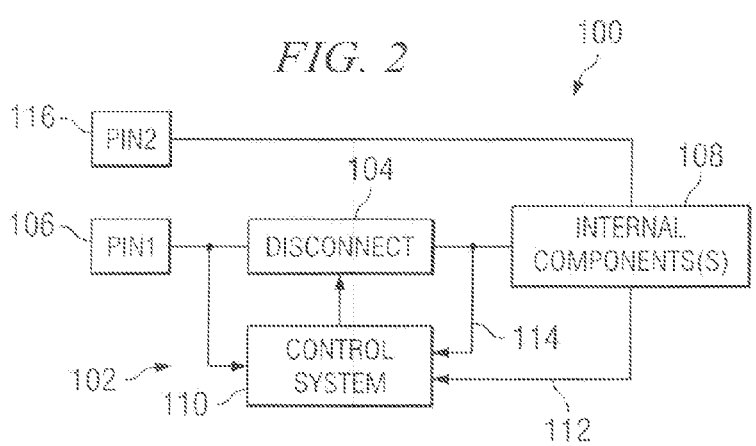
FIG. 2 illustrates an example of a system for protecting circuit components in accordance with an aspect of the invention.

FIG. 2 illustrates an example of part of an IC 100 implementing a protection system 102 in accordance with an aspect of the present invention. The protection system 102 includes a disconnect element 104 connected between a pin 106 and one or more internal components 108. The disconnect element 104 can be implemented as a device configured to permit an electrical signal to propagate unimpeded from the pin 106 to the internal components 108 when in a first state and to provide a substantially galvanic barrier that prevents transmission of the electrical signal when in a second state. By "galvanic barrier" it is meant that the disconnect element 104 provides a physical isolation barrier (e.g., very high impedance, such as on the order of giga ohms) between the pin 106 and the one or more components 108. For example, the disconnect element 104 can be a fuse link. Other types of disconnect elements 104 can also be utilized, such as a transmission gate (tgate) device or other IC components that can be triggered to provide an appropriate high impedance path between the pin 106 and the internal components 108.

The protection system 102 also includes a control system 110 that controls the disconnect element 104, by causing a transition from the first state to the second state, based on at least one predetermined activation condition. The control system 110 can include control logic and drive circuitry configured to activate the disconnect element 104 to the second state to provide desired isolation barrier between the pin 106 and the one or more circuit components 108. The activation condition can correspond to a condition associated with the one or more components 108 and/or correspond to an electrical condition at the pin 106. The electrical condition at pin can be detected as the voltage at a node between the disconnect element 104 and the one or more circuit components 108, as depicted at 114. The IC 100 also includes another pin 116 that can be utilized to provide a second signal (e.g., a data signal) to the internal components 108.

The control system 110, for example, can receive an input signal 112 from internal components 108 as well as monitor the voltage at the pin 106. The control system 110 can detect the activation condition when the input signal 112 has a predetermined value concurrently with the voltage at the pin 106 exceeding a predetermined threshold. The input signal 106 can be provided as a single or multi-bit signal having a value that is set to define an operating condition associated with the protected circuit components 108. The value of the input signal 112 can be entered as input data, such as via another pin 116 of the IC 100.

As used herein and in the appended claims, the phrase "exceeding a predetermined threshold" and variants thereof is meant to include both being greater than a positive threshold and being less than a negative threshold. The appropriate relationship between the threshold and the voltage at the pin 106 can be established according to the configuration of the protection system 102 and the voltage levels within the IC 100. It is further to be appreciated that the protection system can be configured to trigger the disconnect element 104 if the voltage at the pin 106 either is greater than a positive threshold or is less than a negative threshold.

By way of further example, the internal component 108 can include a programmable memory device (e.g., EEPROM) having a plurality of operating modes. The input signal 112 can be set with a value the defines an operating mode of the programmable memory device, such as including a load mode, a preview mode, a program mode or a protection activation mode. The protection activation mode can be set (e.g., via the pin 116), for example after the memory has been successfully programmed with data. The pin 106 can correspond to an enable pin to which a corresponding program voltage (e.g., a clock signal) is provided for programming the programmable memory device. The voltage at the pin 106 can vary according to the operating mode of the programmable memory. For instance, during a normal operating mode, including a load mode and preview mode, the voltage at the pin 106 can be provided as a clock signal that alternates between electrical ground and a regulated voltage for the IC 100 (e.g., typically ranging from about 5V to 5.5V). The voltage can be provided to the pin 106 at a significantly higher peak voltage (e.g., a program voltage ranging from 12 V to about 15 V or even higher) to program data into the memory while in a program mode. The program voltage can also be utilized to trigger the activation condition. In contrast, the voltage at the pin 116 remains less than or equal to the regulated voltage during all modes. The pin 116 can correspond to a data pin that is used for entering data for programming the memory and for setting the operating mode of the memory.

Conventional ESD protection circuitry (not shown) is usually effective in limiting transients at the pin 116, but may not be entirely effective at pin 106 due to the high voltages that are often applied, such as during programming. Thus, the internal components may 108 become vulnerable to voltage spikes and other transients at the pin 106. The programming content can be lost even though there is no damage from the ESD event. The activation condition can be utilized to trigger additional protection for the internal components 108, such as after the internal circuitry has been programmed or configured to a desired state. In response to detecting the activation condition, the control system 110 activates the disconnect element 104 to the second state in which a physical isolation barrier (e.g., very high impedance structure) is provided between the pin 106 and the internal components 108. The physical isolation barrier can be permanent, alternatively, it can be programmable. The physical isolation effectively mitigates vulnerability of the internal component to spikes or other voltage increases that might subsequently occur at the pin 106.

Figure 3:
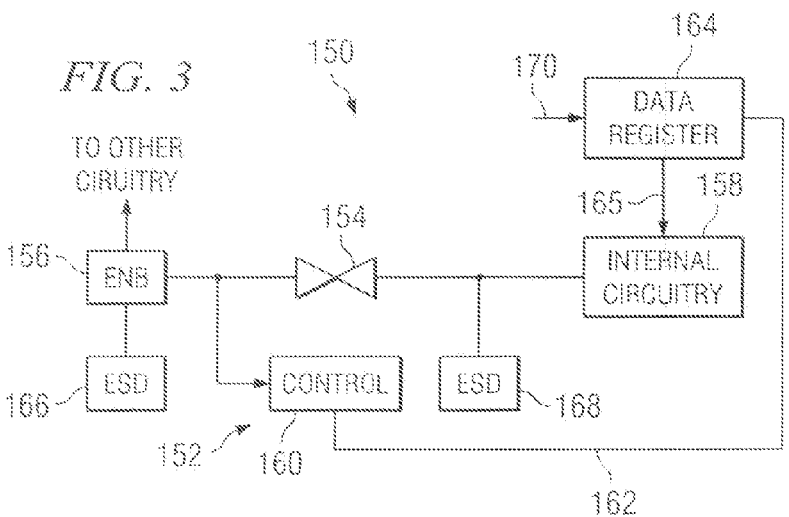
FIG. 3 illustrates another example of a system for protecting circuit components in accordance with an aspect of the invention.

FIG. 3 depicts an example of part of an IC 150 implementing a protection system 152 according to an aspect of the present invention. The protection system 152 includes a transmission gate (tgate) 154 connected between an enable input pin 156 and internal circuitry 158. A transmission gate consists of N-Type and one P-Type transistor connected in parallel and controlled by inverted gate voltages. A control system 160 is connected to control the operation of the tgate 154 in response to detecting an activation condition. For example, the activation condition can be detected as a function of the state of a control input 162 and the voltage at the pin 156. In the example of FIG. 3, ESD protection circuitry 166 is provided at the pin 156, which can be internal or external relative to the IC 150. Additional ESD protection circuitry 168 can also be connected at the node between the tgate 154 and the internal circuit component 158.

The control input 162 can be provided by a data register 164 of the IC 150. The control input can correspond to one or more bits of the data register. As one example, the internal circuitry 158 can include an EEPROM and control input 162 from the data register can correspond to two bits of the data represent control bits for the state of the EEPROM. The data register 164 can also contain other data bits, such as are provided as data signals 165 to the internal circuitry 158.

The control input 162 and the data signals 165, for example, can be programmed based on another input signal 170. The input signal 170, for instance, can correspond to an input signal provided at or below a regulated voltage from another pin (not shown) of the IC. That is, the control input signal 162 provided by the data register 164 is set as a function of the input signal 170. In contrast, the signal provided at the pin 156 can correspond to an enable signal (e.g., a clock signal) that is normally provided in more than one voltage mode. For example, a normal operating mode can provide the enable signal as a clock signal to the pin 156 at or below the regulated voltage. Additionally, the voltage provided at the pin 156 can be provided at an elevated voltage that is substantially higher than the regulated voltage. Accordingly, the ESD protection devices 166 and 168 are configured to permit the elevated voltages at the pin 156.

The tgate 154 can operate in a first (e.g., ON) state that freely passes the enable input signal from the pin 156 to the internal circuitry 158 and a second (e.g., OFF) state that provides a very high impedance to block the enable input signal from being transmitted through the tgate. The control system 160 can include logic configured to detect the activation condition based on the control input signal 162 and based on the level of the enable input signal at the pin 156 exceeding a predetermined voltage threshold. The control system 160 can also include circuitry configured to turn off the tgate 154, which can be permanently or programmable based upon the control circuitry implemented therein. Examples of possible control circuitry are shown and described with respect to FIG. 5.

Figure 4:
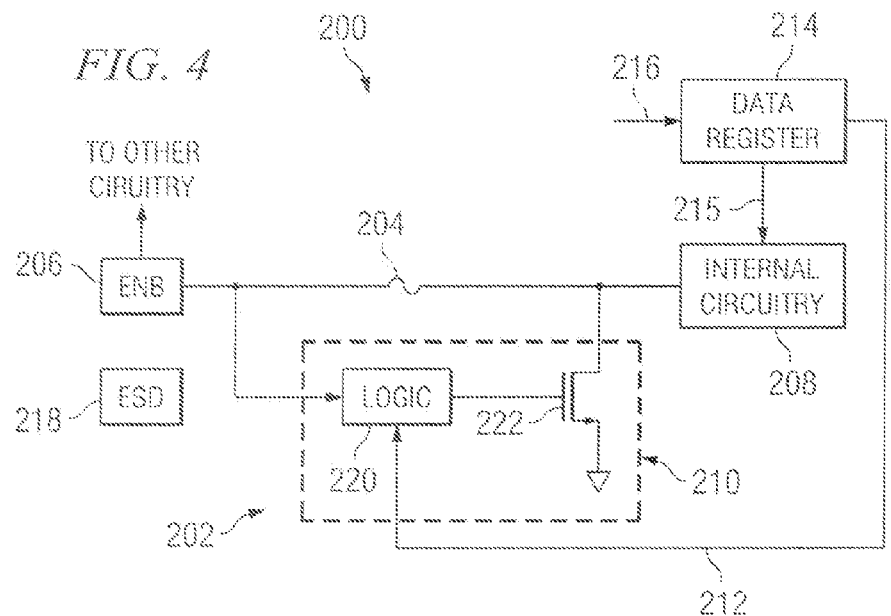
FIG. 4 illustrates yet another example of a system for protecting circuit components in accordance with an aspect of the invention.

FIG. 4 depicts an example of part of an integrated circuit 200 implementing a protection system 202 that can be implemented in accordance with an aspect of the present invention. In the example of FIG. 4, the disconnect element is depicted as a fuse link 204 that is connected between a pin 206 of the IC 200 and an internal circuitry 208. The fuse link 204 thus provides a permanent galvanic solution for disconnecting the input pin 206 from the internal circuitry 208.

A control system 210 controls the fuse link 204 based upon a control input signal 212 provided by a data register 214. The data register 214, for example, is configured to provide data 215 to the internal circuit component 208 based on a corresponding input signal 216. Because the fuse link 204 can be activated to provide a permanent physical isolation barrier between the pin 206 and the internal circuitry 208, no ESD protection device is required between the pin 206 and the circuit component 208. However, conventional ESD protection may still be provided at the pin 206, as indicated at 218.

In the example of FIG. 4, the control system 210 includes a logic block 220 coupled to a transistor device 222. The transistor device 222 is connected between a node, which interconnects the fuse link 204 and the internal circuitry 208, and electrical ground. The logic block 220 is configured to provide a logic output signal to operate the transistor 222 based on determining the occurrence of an activation condition. The logic block 220 is configured to ascertain the occurrence of an activation condition based on the control input signal 212 and based on the voltage of the signal provided at the pin 206. Thus, when the logic block detects an activation condition, the logic block drives the gate of the transistor device 222 so as to conduct current from the internal node through the transistor device to electrical ground. By shunting current through the transistor device 222 in this way, sufficient current is pulled through the fuse link 204 to blow the fuse link and thereby provide a substantially galvanic barrier between the pin 206 and the internal circuitry 208. Even with the galvanic barrier provided by the fuse link 204, the enable signal provided at the pin 206 may still be provided to other circuitry through other internal circuit connections (not shown). However, potential spikes and transients at the pin 206 are permanently isolated from the internal circuitry 208.

Figure 5:
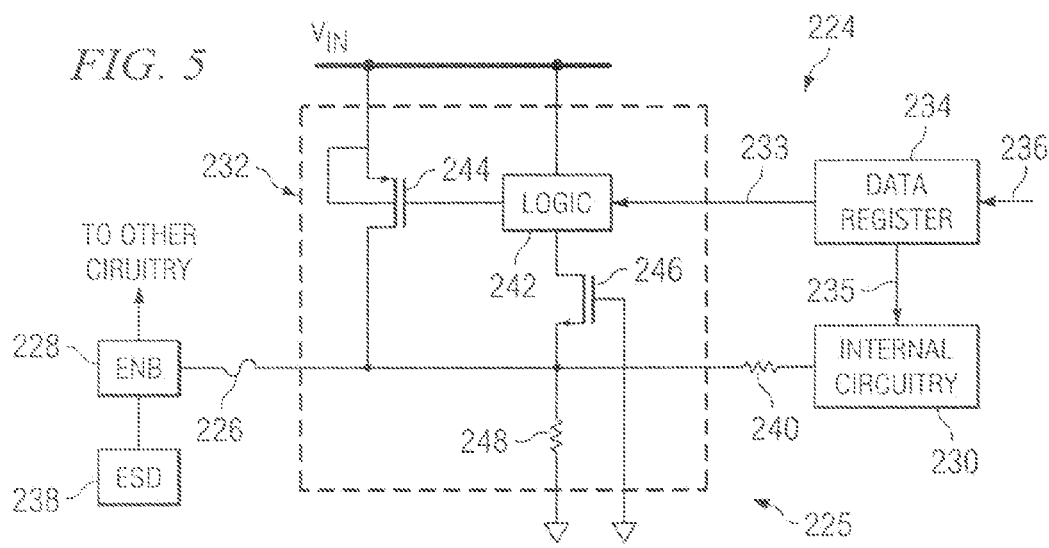
FIG. 5 illustrates another example of a system for protecting circuit components in accordance with an aspect of the invention.

FIG. 5 depicts an example of part of an integrated circuit 224 implementing a protection system 225 that can be implemented in accordance with another aspect of the present invention. Similar to the example of FIG. 4, the disconnect element is depicted as a fuse link 226 that is connected between a pin 228 of the IC 224 and internal circuitry 230. In the example of FIG. 5, however, the fuse link 226 is activated to disconnect the pin 228 from the internal circuitry 230 in response to the occurrence of a sufficiently negative voltage being applied at the pin 228. By blowing the fuse link 226 (like the example of FIG. 4), a permanent galvanic barrier is provided to disconnect the input pin 228 from the internal circuitry 230.

The protection system 225 includes a control system 232 is configured to control the fuse link 226 based on a control input signal 233 provided by a data register 234 and the voltage at the pin 228. The data register 234, for example, is configured to provide data 235 to the internal circuitry 230 based on a corresponding input signal 236. Because the fuse link 226 can be activated to provide a permanent physical isolation barrier between the pin 228 and the internal circuitry 230, no ESD protection device is required between the pin 228 and the circuit component 208. However, ESD protection may still be provided at the pin 228, as indicated at 238. An additional resistor (e.g., about 10 KΩ or greater) 240 can be connected in series between the fuse link 226 and the internal circuitry 230 to help protect the internal circuitry.

In the example of FIG. 5, the control system 232 includes a logic block 242 that is coupled to control a transistor device 244 for blowing the fuse link 226. The transistor device 244 is connected between $V_{IN}$ (e.g., a positive voltage supply rail for the IC) and an internal node between the resistor 240 and the fuse link 226. The logic block 242 is configured to provide an output signal to turn the transistor 244 based on determining the occurrence of an activation condition. In the example of FIG. 5, the transistor device is implemented as a P-channel field effect transistor (PFET), such that an output from the logic block provides a gate-to-source voltage sufficient to turn on the PFET and source current for blowing the fuse link 226. An NFET could also be used for blowing the fuse link if a charge pump gate voltage were available.

The logic block 242 is configured to ascertain the occurrence of an activation condition based on the control input signal 233 and based on the voltage of the signal provided at the pin 228, as represented at the internal node between the fuse link 226 and the resistor 240. In particular, a transistor device 246 (e.g., an N-channel field effect transistor (NFET)) is connected between the internal node and the logic block 242, and a resistor 248 is connected between the internal node and electrical ground. The gate of the transistor is 246 is connected to a voltage level (e.g., electrical ground) that requires a negative voltage at the internal node to establish a requisite gate-to-source voltage for biasing the transistor to an on condition. Thus, it will be appreciated that the gate voltage of the transistor 246 can be set to any voltage to establish a desired negative voltage threshold at the pin 228 for the activation condition. Thus, when the logic block 242 detects the activation condition (e.g., a sufficient negative voltage at the internal node and the control input signal 233), the logic block drives the gate of the transistor device 244 so as to conduct current from $V_{IN}$ through the transistor device to the pin 228, to which the negative voltage is being applied. By shunting current through the transistor device 222 in this way, sufficient current is sourced through the fuse link 226 to blow the fuse link and thereby provide a substantially galvanic barrier between the pin 228 and the internal circuitry 230. Even with the galvanic barrier provided by the fuse link 226, the signal provided at the pin 228 may still be provided to other circuitry through other internal circuit connections (not shown). However, potential spikes and transients at the pin 228 are permanently isolated from the internal circuitry 230. While the examples of FIGS. 4 and 5 are depicted separately, it is to be understood that an IC can be configured to implement both approaches, such as to provide a wider range of options for blowing the fuse link.

Figure 6:
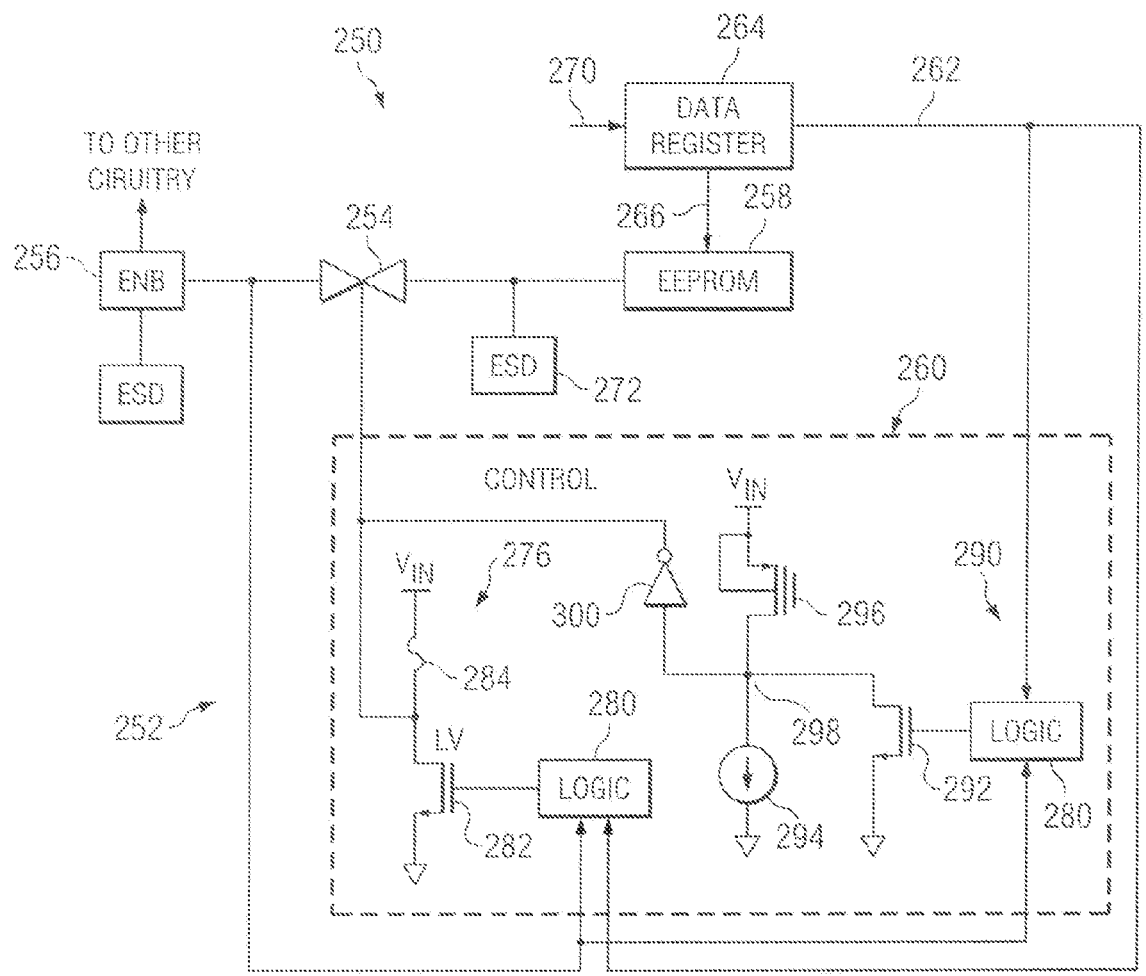
FIG. 6 illustrates still another example of a system for protecting circuit components in accordance with an aspect of the invention.

FIG. 6 depicts an example of part of an integrated circuit 250 implementing protection system 252 according to an aspect of the present invention. In the example of FIG. 6, the protection system 252 is illustrated as including a tgate 254 connected between an input pin 256 and an EEPROM 258, although this approach is not limited to use with a tgate type of disconnect element. A control system 260 is connected to control the tgate 254 based on a control input signal 262, such as a mode control signal, provided by a data register 264. For example, the control input signal 262 can have a value that indicates an operating mode of the EEPROM 258, such as corresponding to one or more bits of the data register 264. As one example, the control input signal 262 can be implemented as a two-bit word that defines the operating mode of the EEPROM, such as set forth in Table 1.

TABLE 1

| CONTROL BITS | | DESCRIPTION |
|---|---|---|
| 0 | 0 | Load |
| 0 | 1 | Preview |
| 1 | 0 | Program |
| 1 | 1 | Activation |

The data register 264 can also provide other multi-bit data 266 to the EEPROM 258 corresponding to data that is being programmed into the EEPROM. The program data 266 as well as the control bits of the control input signal 262 are provided based on input data 270 that is entered into the data register 254, such as via a data pin (not shown). The data pin provides the data signal 260 at or below a regulated voltage. For example, the data provided at the data pin can be clocked into the data register 264 as a function and at a rate according to the enable signal provided at the pin 256. The enable signal at the pin 256 is provided at the lower regulated voltage during normal operating mode, and at a higher programming voltage for programming the data into the EEPROM.

Due to the requirement that the ESD protection circuitry 272 should permit higher voltages at the pin 256 to allow programming of the EEPROM, the EEPROM may become vulnerable to voltage spikes at the pin 256 in the absence of the protection system 252. The control system 260 is configured to turn off or deactivate the tgate 254 in response to detecting the activation condition. As described herein, the activation condition can be detected as a function of the control input signal 262 and the voltage at the pin 256. For example, a higher programming voltage can also be employed at the pin 256 to trigger deactivation of the tgate 154 provided that the control input signal 262 concurrently has a value (e.g., 11) that defines the activation mode. The control system 260 can be configured to turn off the tgate 254 permanently or it can be programmable to change the state of the tgate.

The control system 260 can be implemented with one or more control circuits, such as depicted in FIG. 6. A first control circuit 276 includes a logic block 280 that detects the activation condition based on the control input signal (e.g., control bits) 262 from the data register 262 and based on the voltage of the signal at the pin 256. For example, the logic 280 can include a comparator that compares the voltage at 256 relative to a predetermined high voltage threshold and provides a comparator output signal (e.g., a logic signal) based on such comparison. If the voltage at 256 exceeds the predetermined threshold voltage and the control input signal 262 has a predetermined value, an activation condition exists.

The logic 280 is coupled to drive a transistor device 282 upon determining that the activation condition exists. The transistor device 282 is connected in series with a fuse link 284 between a regulated voltage, indicated a VIN, and electrical ground. Thus, when the logic 280 drives the transistor 282 to conduct current through the device, the fuse link 284 is blown. When the fuse link 284 is blown, the control input of the tgate 254 is pulled low through the transistor 282 so as to turn off the tgate permanently. Those skilled in the art will understand and appreciate that other implementations and configurations that could be used for the tgate 254, which might require different voltage levels to turn off the tgate. Other permanent solutions can also be used in place of the fuse link 284.

The other control circuitry 290 corresponds to a one-time programmable network. The control circuitry 290 includes a logic block 280 that is operative to detect the activation condition. For purposes of simplicity of explanation, the logic block 280 is identified by the same reference number as the logic block in the control circuitry 276. It will be understood and appreciated that logic blocks can be the same or different. The logic block 280 drives a transistor device 292 that is connected in parallel with a current source 294 between a node 298 and electrical ground. The current source 294 can be a weak current source (e.g., about 20 nA) implemented using appropriately configured and sized transistor devices. A floating gate transistor device (e.g., a floating gate PMOS device) 296 is connected between a regulated voltage ($V_{IN}$) and the node 298. In response to the control input 262 indicating the activation mode and the voltage at the pin 256 exceeding a predetermined high-voltage threshold (e.g., greater than about 12-14 V), the logic 280 turns on the transistor device 292. When the transistor device 292 is activated, the gate of the floating gate P-channel device 296 charges and, in turn, activates the P-channel device to supply current (the P-channel device being stronger than the current source 294), such that the node 298 is pulled high through the floating gate P-channel. The signal at 298 can be inverted through an inverter 300 (assuming a logic low is required to turn off the tgate) and provided as a corresponding control signal to turn off the tgate 254.

While the control system of FIG. 6 has been described in the context of controlling the tgate 254, it will be understood and appreciated that each of the control circuitry 276 and 290 are equally applicable as controls for other types of protection systems implemented according to an aspect of the present invention. Each of the control circuitry 276 and 290 can be utilized individually or in combination as part of a control system for implementing a protection system according to an aspect of the present invention. Alternatively, both types of control systems can be utilized to enable selection of either a permanent deactivation of the tgate 254 or programmable type of connection through the one time programmable device 290 to disconnect the pin 256 from the EEPROM 258.

By way of further example, to create a one time reversible barrier, one could use multiple fuse links or multiple transistors 292 in concert with a logic arrangement. For instance, a logic control input of 011 (e.g., assuming a three bit arrangement) can be provided to disconnect input pin 256 from the EEPROM 258, a control input of 001 would re-connect the pin with the EEPROM, and 000 could subsequently be provided to again disconnect the pin from the EEPROM. Those skilled in the art will understand and appreciate various other approaches that could be utilized to implement other forms of protection based on the teachings contained herein.

Figure 7:
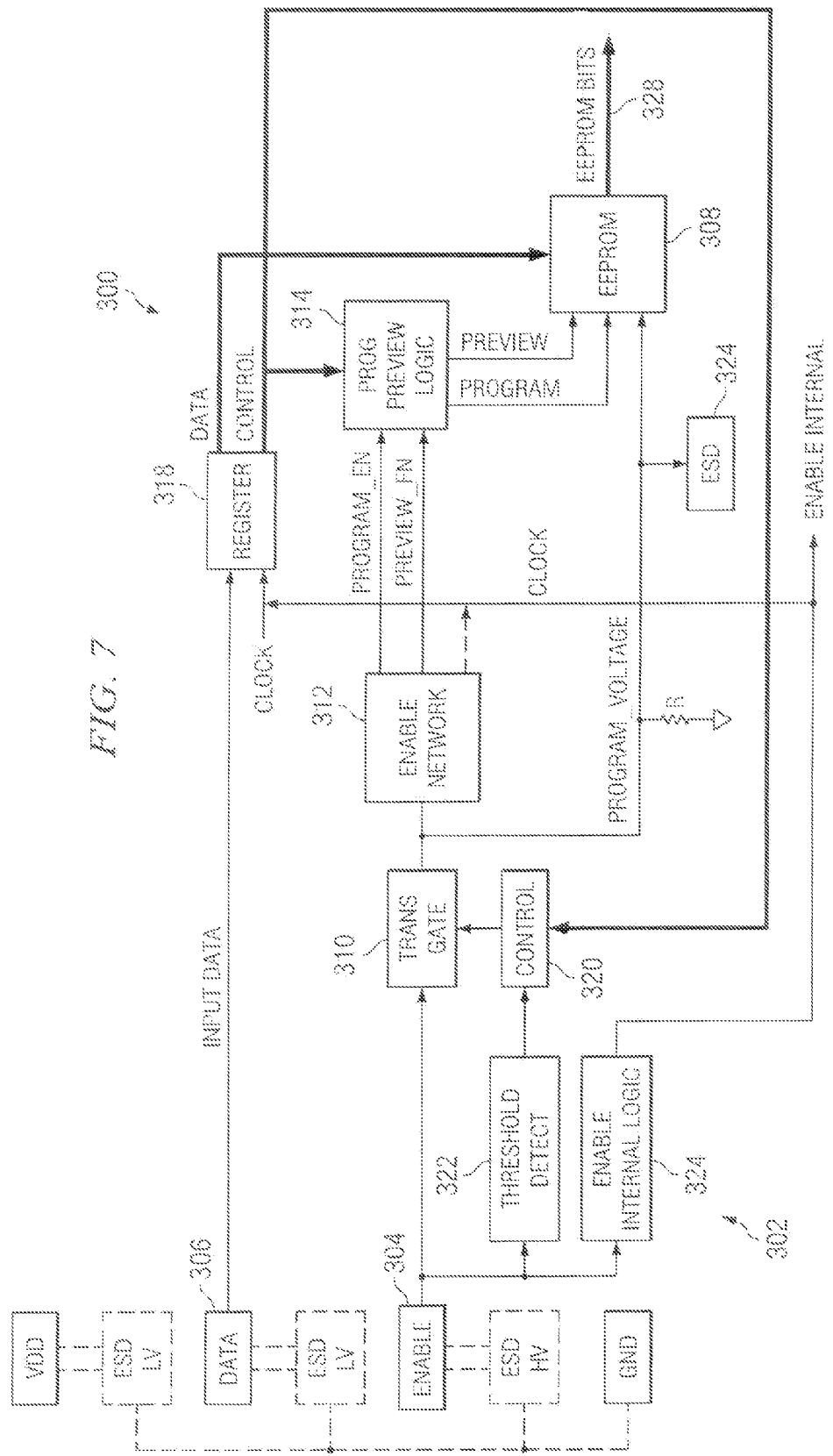
FIG. 7 illustrates part of an integrated circuit implementing a protection system in accordance with an aspect of the invention.

FIG. 7 depicts an example of another type of integrated circuit 300 that can include a protection system 302 in accordance with an aspect of the present invention. The example of FIG. 7 is provided in the context of a pair of pins 304 and 306 of the IC 300 that are utilized in connection with programming an EEPROM 308. Thus, the circuit of FIG. 7 depicts additional circuitry associated with implementing the programming and testing of the EEPROM as well as associated circuitry for the protection system 302.

FIG. 7, the protection system 302 includes a tgate 310 that is connected between the enable pin 304 and the EEPROM 308. The tgate 310 is configured during normal operation to provide the enable signal provided at 304 to the EEPROM as well as to an associated enable network 312. The enable network 312 is configured to provide enable signals to associated program and preview logic 314. For example, the enable network 312 can provide a preview enable (PREVIEW_EN) signal to the logic 314 when the program voltage provided at the enable pin 304 is at a first level, such as corresponding to a regulated voltage level ($V_{DD}$). $V_{DD}$ can be generated internally within the IC 300 or it can be provided by external circuitry to the IC via another pin. Additionally, the enable network 312 can provide a program enable (PROGRAM_EN) signal 314 when the signal provided at the pin 304 has a higher programming voltage. The enable network 312 can also help provide an internal CLOCK signal to associated circuitry of the IC 300.

INPUT DATA can be entered at the data pin 306 for programming the EEPROM 308, including program data and mode control data. A register 318 stores the data entered at the data pin 306. The register 318 can be implemented as a multi-bit shift register that provides a multi-bit output, including DATA and CONTROL bits. The DATA bits are provided as a multi-bit output to the EEPROM 308 and contains values (e.g., trim values) that can be programmed into the EEPROM 308. The CONTROL bits of the register 318 can be provided to the program preview logic 314 for controlling the corresponding mode of the EEPROM. For example, the CONTROL bits can correspond to a multi-bit word, such as shown and described with respect to Table 1. The program preview logic 314 in turn provides PROGRAM and PREVIEW control signals to the EEPROM 308. Thus, the EEPROM 308 can be programmed with the DATA when the CONTROL bits provided by the register 318 and the PROGRAM_EN signal have certain predetermined values. Similarly, when the CONTROL bits and the PREVIEW_EN signal have other predetermined values the program preview logic 314 can activate a preview of the data that is to be written to the EEPROM 308.

The CONTROL bits are also provided to a control system 320 that is configured for controlling the tgate 310. The control system 320 includes logic and drive circuitry that cooperate to control the tgate 310 in response to detection of an activation condition. An additional logic input can be provided by a threshold detection circuit 322. The threshold detection circuit 322 monitors the voltage provided at the enable pin 304 and provides a corresponding logic output based on a comparison of the pin voltage relative to a predetermined programming threshold (e.g., at a logic HIGH when the threshold has been reached or exceeded). Those skilled in the art will understand and appreciate various types of comparator circuits and various threshold levels that can be utilized by the threshold detection circuit 322 for providing a corresponding output to the control system 320.

The control system 320 provides a control signal to turn off the tgate when the CONTROL bits provided by the shift register 318 have been set to a value (e.g., 11) indicating that programming of the EEPROM 308 has been completed and when the signal from the threshold detection circuit 322 indicates that the programming voltage at the pin 304 exceeds a predetermined threshold, which is substantially above the regulated voltage. The control system 320 can be configured to turn off the tgate 310 permanently or, alternatively, the control system can be programmable, such that the tgate may be turned back on to connect the enable pin 304 with the EEPROM 308. Additionally, ESD protection device 326 can be provided at the program input to the EEPROM between the tgate 310 and the EEPROM for providing corresponding ESD protection, such as is known in the art.

The IC 300 can also include an enable internal logic block 324 that can provide a corresponding clock signal for enabling other internal components of the IC 300. For example, the enable internal logic 324 can be circuitry configured to provide a clock signal at or below a corresponding regulated level ($V_{DD}$) regardless of the voltage level of the signal provided at the enable pin 304. Data thus may be provided as a serial stream of data to the data pin 306 that is clocked into the register 318 based on the clock signal. After an appropriate stream of data has been loaded into the register 318, the data can be verified, such as by entering the preview mode via the CONTROL bits and observing the data (e.g., with a programming tool). If the data that has been entered into the shift register is verified during the preview mode, appropriate CONTROL bits can be entered into the shift register 318 for entering the corresponding program mode. As an example, a program voltage level (e.g., typically about twice $V_{DD}$) can be provided to the enable pin 304 in conjunction with shifting in the program control bits to the shift register such that the data output of the shift register is utilized to program corresponding bits of the EEPROM. However, since the control bits do not correspond to the activation condition, the control system 320 would not turn off the tgate 310. After the programming has been completed, corresponding CONTROL bits (e.g., 11) can be shifted into the shift register 318 and the corresponding program voltage level provided at the enable pin 304 such that the activation condition exists and the control system 320 turns off the tgate 310. After the EEPROM 308 has been programmed, corresponding output EEPROM data bits 328 can be provided to other circuitry in the IC, such as for trimming parameters of the IC 300.

Figure 8:
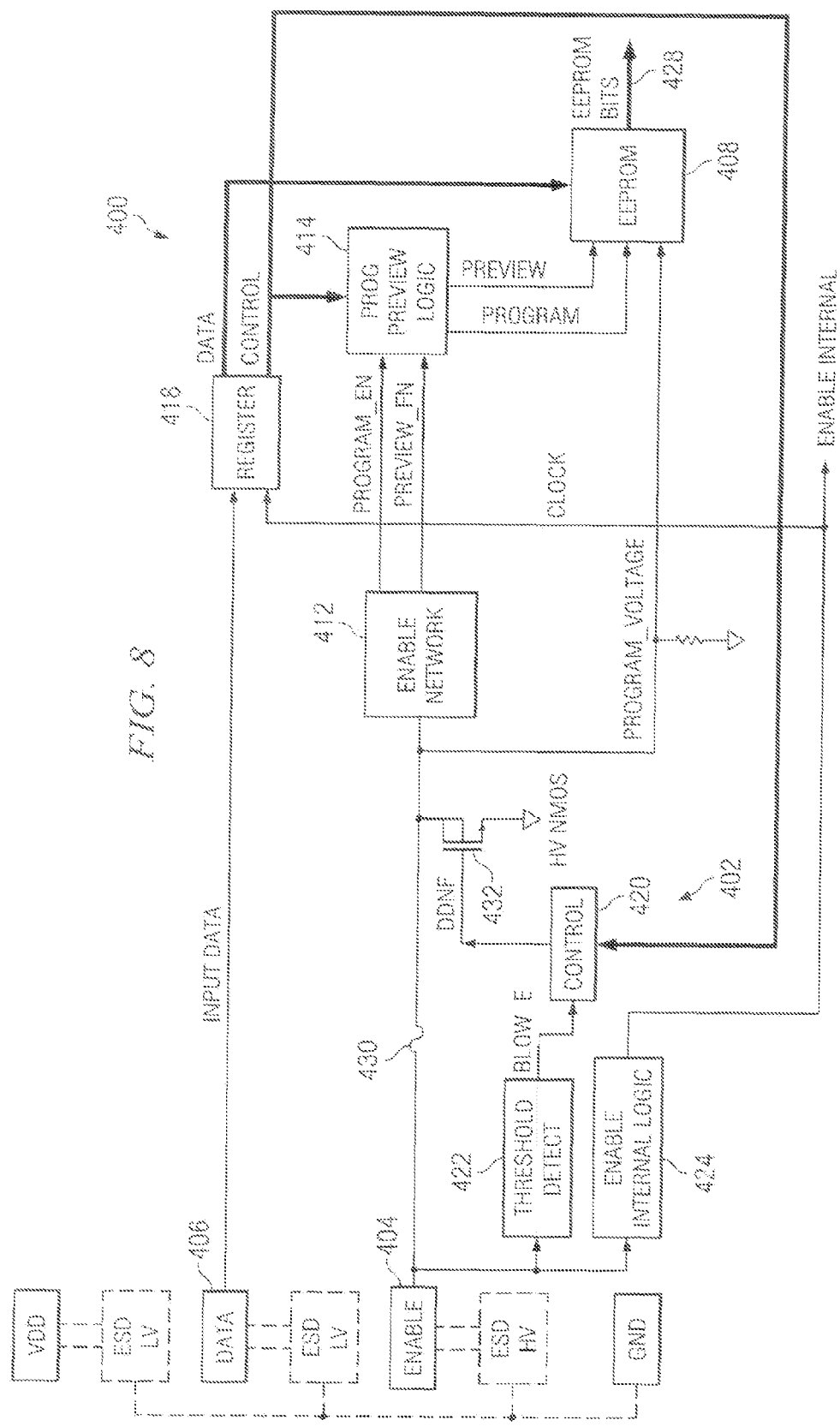
FIG. 8 illustrates part of an integrated circuit implementing another type of protection system in accordance with an aspect of the invention.

FIG. 8 depicts part of an IC 400, much of which is substantially similar to the circuitry depicted in FIG. 7. Accordingly, for purposes of brevity, identical reference numbers, which have been increased by adding 100, refer to corresponding components and circuitry previously described with respect to FIG. 7. Reference may thus be made to the portions of IC 400 previously described with respect to FIG. 7 for additional information of such components.

Referring to FIG. 8, the IC 400 includes a protection system 402 in accordance with an aspect of the present invention. The protection system 402 depicted in FIG. 8 includes as a fuse link 430 connected between an enable pin 404 and an EEPROM 408. The protection system 402 also includes a control system 420 that is configured to control the fuse link 430. The control system 420 is coupled to an NMOS device 432 that is connected between the fuse link 430 and electrical ground. In this configuration, the NMOS device must be capable of sustaining a drain voltage substantially higher than the regulated voltage of pin 228. Another possible configuration is described with respect to FIG. 5. The control system 420 provides a corresponding output signal to the gate of the NMOS device 432 for pulling current through the device upon detecting the activation condition.

As mentioned above, the activation condition can exist when control bits (defined by the DATA signal) have been set to indicate the activation condition and when the voltage provided to the enable pin 404 has exceeded the predetermined voltage threshold. When activated, the fuse link 430 operates in a manner as shown and described with respect to FIG. 4 (although it could be configured as in FIG. 5 as well); namely, to provide a permanent and substantially galvanic isolation barrier between the enable pin 404 and the EEPROM 408. Those skilled in the art will understand and appreciate other implementations and types of circuitry that can utilize protection systems according to an aspect of the present invention.

What have been described above are examples of the present invention. It is, of course not possible to describe every conceivable combination of components or methodologies for purposes of describing the present invention, but one of ordinary skill in the art will recogize that many further combinations and permutations of the present invention are possible. accordingly, the present invention is intended to embrace all such alterations, modifications, and variations that fall within the spirit and scope of the appended claims.

What is claimed is:

1. A system for protecting at least one component in an integrated circuit (IC), the system comprising:
   a disconnect element electrically connected in series between a terminal of the IC and the at least one component, the disconnect element being configured to have a first state to permit an electrical signal to propagate from the terminal to the at least one component and a second state corresponding to a high impedance condition that electrically disconnects the terminal relative to the at least one component; and
   a control system configured to cause the disconnecting element to transition from the first state to the second based on at least one predetermined activation condition;
wherein the at least one activation condition further comprises exceeding a predetermined voltage at the terminal concurrently with input data that has been set to define an operating mode of the at least one component, the system further comprising a threshold detector that provides an output signal based on comparison of the voltage at the terminal relative to a predetermined threshold, the control system detecting the activation condition based on the output signal from the threshold detector and based on the input data that has been set to define the operating mode of the at least one component.

2. A system for protecting at least one component in an integrated circuit (IC), the system comprising:
   a disconnect element electrically connected in series between a terminal of the IC and the at least one component, the disconnect element being configured to have a first state to permit an electrical signal to propagate from the terminal to the at least one component and a second state corresponding to a high impedance condition that electrically disconnects the terminal relative to the at least one component; and
   a control system configured to cause the disconnecting element to transition from the first state to the second based on at least one predetermined activation condition;
wherein the at least one component comprises a programmable memory device, the system further comprising a data register that stores data for programming into the programmable memory device and control bits, the control bits having a value that defines a plurality of operating modes, one of the operating modes including an activation mode that is set after the programmable memory device has been programmed, the control system detecting the activation condition based on the control bits corresponding to the activation mode and based on the signal at the terminal of the IC exceeding a predetermined threshold.

3. The system of claim 2, wherein the terminal is a first pin and the programmable memory device comprises an electrically erasable programmable read-only memory device, the EEPROM being programmable with data that is supplied to a second pin at or below a regulated voltage of the IC while an elevated program voltage is supplied to the first pin that exceeds the regulated voltage of the IC.

4. A system for protecting at least one component in an integrated circuit (IC), the system comprising:
  a disconnect element electrically connected in series between a terminal of the IC and the at least one component, the disconnect element being configured to have a first state to permit an electrical signal to propagate from the terminal to the at least one component and a second state corresponding to a high impedance condition that electrically disconnects the terminal relative to the at least one component; and
  a control system configured to cause the disconnecting element to transition from the first state to the second based on at least one predetermined activation condition;
wherein the control system further comprises:
  logic configured to determine the occurrence of the at least one activation condition and to provide a logic signal indicative thereof; and
  circuitry coupled to the disconnecting element and configured to cause the disconnecting element to implement the high impedance condition based on the logic signal.

5. The system of claim 4, further comprising a threshold detector provides an output signal having a state that varies based on comparison of the voltage at the terminal relative to a predetermined threshold, the logic detecting the activation condition based on the output signal from the threshold detector and control information that is set to define an operating mode of the at least one component.

6. The system of claim 5, wherein the terminal is a first pin of the IC, the system further comprising a data register configured to store control data, which includes the control information, based on data entered at a second pin of the IC, the logic detecting the occurrence of the activation condition in response to the output signal having a predetermined state and the control information corresponding to control bits having a predetermined value.

7. The system of claim 6, wherein the circuitry comprises a programmable circuitry that is activated in response to the logic signal indicating the occurrence of the activation condition, such that the high impedance condition remains substantially permanent unless reversed by receiving a deactivation signal from the data register.

8. The system of claim 4, wherein the circuitry comprises a fuse link that is blown by the circuitry in response to the logic signal indicating the occurrence of the activation condition, such that the high impedance condition is permanent.

9. An integrated circuit (IC) chip comprising:
  a first pin;
  a disconnect element electrically connected between the first pin and protected circuitry, the disconnect element configured to have a first condition to electrically connect the first pin to the protected circuitry and a second condition that electrically disconnects the first pin relative to the protected circuitry, a first signal being provided normally to the first pin at one of a regulated voltage for the IC and a voltage that exceeds the regulated voltage;
  a second pin connected to provide a second signal for use by the protected circuitry, the second signal being normally provided at or below the regulated voltage; and
  a control system configured to cause the disconnect element to transition from the first state to the second state and to remain permanently the second state in response to detecting an activation condition;
wherein the control system further comprises:
  logic configured to detect an occurrence of the activation condition based on the first signal and mode control data associated with the protected circuitry; and
  control circuitry coupled to the disconnect element and configured to cause the disconnecting element to transition to the second state in response to the logic detecting the occurrence of the activation condition.

10. The IC chip of claim 9, wherein the control circuitry comprises a fuse link that is blown in response the logic detecting the occurrence of the activation condition based on the mode control data being set to define an activation mode and the first signal exceeding a predetermined voltage threshold.

11. An integrated circuit (IC), comprising:
  a first pin;
  a disconnect element electrically connected between the first pin and programmable circuitry within the IC, the disconnect element being configured to have a first condition to electrically connect the first pin to the programmable circuitry and a second condition that electrically isolates the first pin relative to the programmable circuitry, a signal being provided at the first pin at a regulated voltage for normal operation of the IC and at a higher program voltage, which that exceeds the regulated voltage, for implementing programming the programmable circuitry;
  a register that receives a second signal having data for programming the programmable circuitry, the second signal being normally provided at or below the regulated voltage; and
  a control system configured to cause the disconnect element to transition from the first state to the second in response to detecting an activation condition, the activation condition being detected based on the first signal and the second signal.

12. The IC of claim 11, wherein the disconnect element further comprises a fuse link, the activation condition being detected in response to the first signal exceeding a predetermined voltage threshold concurrently with the second signal setting control bits to an activation mode.

* * * * *